United States Patent [19]
Murata et al.

[11] Patent Number: 5,443,346
[45] Date of Patent: Aug. 22, 1995

[54] WAFER CONVEYING SYSTEM IN A CLEAN ROOM

[75] Inventors: Masanao Murata; Teppei Yamashita; Tsuyoshi Tanaka; Takahide Hoshiko; Mitsuji Karita; Hitoshi Kawano; Tutomu Shinya, all of Ise, Japan

[73] Assignee: Shinko Electric Co., Ltd., Japan

[21] Appl. No.: 85,109

[22] Filed: Jul. 2, 1993

[30] Foreign Application Priority Data

Jul. 3, 1992 [JP] Japan ................ 4-177218

[51] Int. Cl.⁶ .......................... B6FG 49/07
[52] U.S. Cl. .................. 414/222; 414/331; 414/416; 414/937; 414/940
[58] Field of Search ........... 414/217, 222, 416, 935, 414/937, 940, 331, 417

[56] References Cited

U.S. PATENT DOCUMENTS

| | | | |
|---|---|---|---|
| 4,643,629 | 2/1987 | Takahashi et al. | 414/937 X |
| 4,955,775 | 9/1990 | Ohkase et al. | 414/940 X |
| 4,990,047 | 2/1991 | Wagner et al. | 414/937 X |
| 5,024,570 | 6/1991 | Kiriseko et al. | 414/935 X |
| 5,061,144 | 10/1991 | Akimoto et al. | 414/935 X |
| 5,110,248 | 5/1992 | Asano et al. | 414/217 X |
| 5,177,514 | 1/1993 | Ushijima et al. | 414/937 X |
| 5,183,370 | 2/1993 | Cruz | 414/937 X |

FOREIGN PATENT DOCUMENTS

| | | | |
|---|---|---|---|
| 1217938 | 8/1989 | Japan | 414/940 |
| 4024915 | 1/1992 | Japan | 414/935 |
| 4267538 | 9/1992 | Japan | 414/940 |

Primary Examiner—Michael S. Huppert
Assistant Examiner—James W. Keenan
Attorney, Agent, or Firm—Bacon & Thomas

[57] ABSTRACT

Disclosed is a wafer conveying system for a clean room which is high in wafer conveying efficiency, and makes it possible to achieve a variety of processing operations with high efficiency. The wafer conveying system in a clean room comprises: an interface equipment cooperating with a conveying system to transfer wafers therebetween which is adapted to convey articles between manufacturing lines; a conveying path extended from the interface equipment; on intra-bay wafer conveying equipment which is moved along the conveying path; and a single or plural wafer processing equipments arranged along the conveying path, thus forming one processing line, the conveying system operating to convey cassettes containing wafers, the interface equipment operating to take a specified number of wafers out of a single or plural cassettes which are delivered to the interface equipment, and place the wafers in an auxiliary cassette provided for the one processing line only, and the intra-bay wafer conveying equipment operating to receive the auxiliary cassette, and move to a specified one of the wafer processing equipments, and to give the wafers to the specified wafer processing equipment and receive wafers therefrom.

11 Claims, 3 Drawing Sheets

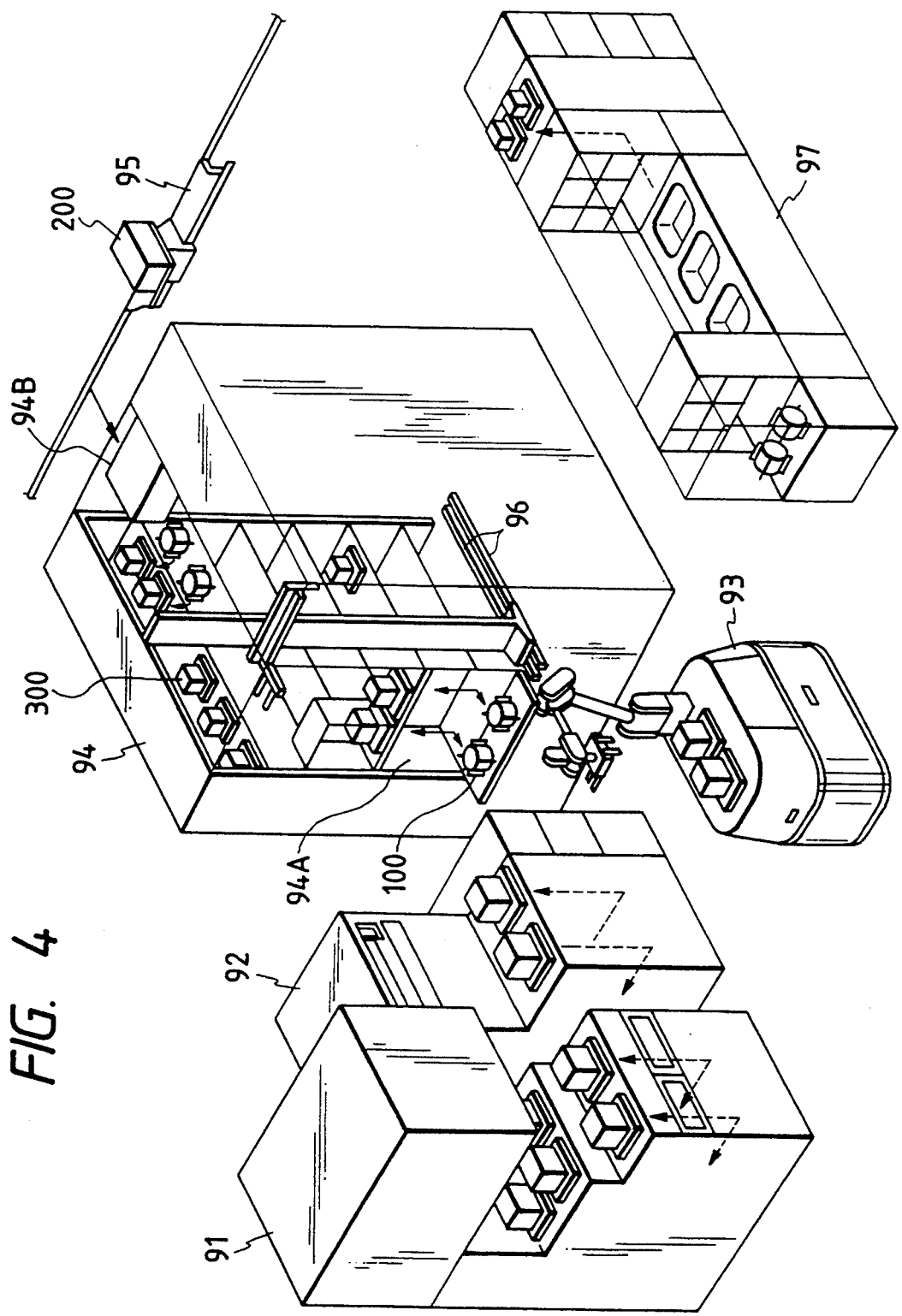

WAFER CONVEYING SYSTEM IN A CLEAN ROOM

BACKGROUND OF THE INVENTION

1. Field of the Invention

This invention relates to a wafer conveying system in a clean room.

2. Description of the Prior Art

FIG. 4 shows one example of the arrangement of equipments installed in a clean room in a conventional semiconductor processing system. In FIG. 4, reference numeral 91 designates a semiconductor processing equipment which incorporates, for instance, a reaction furnance for subjecting wafers to surface treatment; 92, a wafer inspecting equipment; 93, a self-running type cassette placing robot for conveying cassettes; 97, a cassette washing equipment; 94, a wafer storechamber; 94B and 94A, a carry-in gate and a carry-out gate of the wafer storechamber 94, respectively; and 95, a product conveying system (such as a linear-motor-type track) for conveying products between manufacturing lines.

In the semiconductor processing system, cassettes conveyed by the conveying equipment are unloaded at the wafer storechamber 94 and stored on a predetermined shelf therein. In this case, a cassette 100 is stored which is set in a portable container 300. A stacker crane 96 is provided in the wafer storechamber 94. When a cassette 100 is carried in the carry-in gate 94B, the stacker crane 96 is operated to store the cassette 100 on a predetermined shelf. The cassette 100, which is set in a container 300 in the wafer storechamber 94 is delivered to the carry-out gate 94A by the stacker crane 96. Thereupon, the self-running type wafer placing robot 93 operates as follows: That is, it delivers the cassette 100 set in the container 300 to the semiconductor processing equipment 91 as it is, or delivers to the wafer inspecting equipment 92 or the wafer storechamber 94 the container 300 containing the cassette in which wafers processed have been stored.

In the conventional semiconductor manufacturing system, the cassettes 100 each containing a plurality of wafers (for instance twenty-five (25) wafers) are moved from equipment to equipment one at a time.

On the other hand, recently the demand for ASIC (application specific IC) has been increased, and the number of wafers manufactured per lot has been decreased. Therefore, sometimes the number of wafers in the cassette is one or two. Accordingly, in the conventional semiconductor manufacturing system employing the above-described conveying system, the cassette each containing one or two wafers are conveyed. Thus, in the conventional semiconductor manufacturing system, the wafer conveying efficiency is considerably low.

SUMMARY OF THE INVENTION

In view of the forgoing problems, an object of this invention is to eliminate the above-described difficulty accompanying a conventional semiconductor manufacturing system. More specifically, an object of the invention is to provide a wafer conveying system in a clean room which is high in wafer conveying efficiency, and makes it possible to achieve a variety of processing operations with high efficiency.

In order to achieve the above-describe object of the invention, A wafer conveying system of the present invention comprises: an interface equipment, for storing a wafer therein, cooperating with a conveying system to transfer wafers therebetween which is adapted to convey products between manufacturing lines; a conveying path extended from the interface equipment; an intra-bay wafer conveying equipment which is moved along the conveying path; and a single or plural wafer processing equipments arranged along the conveying path, thus forming one processing line, wherein the conveying system operates to convey cassettes containing wafers, the interface equipment operating to take a specified number of wafers out of a single or plural cassettes which are delivered thereto, and to place them in a special cassette provided for the one processing line only or in a predetermined wafer storechamber, and the intra-bay wafer conveying equipment operating to receive the special cassette or wafers from the predetermined wafer storechamber, and move to a specified one of the wafer processing equipments, and give the wafers to the specified wafer processing equipment and receive wafers therefrom.

According to the present invention, a wafer conveying system in a clean room comprises: an interface equipment for transferring wafers between said interface equipment and a wafer conveying equipment which transfers said wafers between wafer processing system; a conveying path extended from said interface equipment; an intra-bay wafer conveying equipment for moving along said conveying path; and a wafer processing equipment arranged along said conveying path to form one processing line, wherein said interface equipment operates to transfer one of said wafers and a cassette containing said wafers between said interface equipment and said wafer conveying equipment, said intra-bay wafer conveying equipment operates to receive one of said wafers and said cassette and moves with one of said wafers and said cassette to said wafer processing equipment, and give said wafers to said wafer processing equipment and receive said wafers therefrom.

According to the present invention, a wafer conveying system in a clean room comprises: an interface equipment for transferring wafers between said interface equipment and a wafer conveying equipment which transfers said wafers between wafer processing system and for storing said wafers therein, said wafer conveying equipment conveying a cassette containing said wafers; a conveying path extended from said interface equipment; an intra-bay wafer conveying equipment for moving along said conveying path; and a wafer processing equipment arranged along said conveying path to form one processing line, said wafer processing equipment including a wafer placing unit for transferring said wafers between said water processing equipment and said intra-bay conveying equipment in a wafer carriage type through a gate, wherein said interface equipment operates to receive said wafers from said cassette conveyed therein to said interface equipment, said interface equipment operates to receive at least one of wafers stored in said interface equipment and moves with wafers to said wafer processing equipment, and give said wafers to said wafer processing equipment and receive said wafers therefrom by said wafer placing unit.

According to another aspect of the invention, in the wafer conveying system of the persent invention, the interface equipment cooperates with the conveying system to transfer wafers or a cassette containing wafers therebetween, and the intra-bay wafer conveying equipment operates to receive the wafers or cassette from said interface equipment, and move to a specified one of the wafer processing equipment, and give the wafers to the specified wafer processing equipment and receive wafers therefrom.

In the wafer conveying system of the present invention, the intra-bay wafer conveying equipment comprises a conveying carriage, on which a wafer placing robot is mounted, and each wafer processing equipment has a gate containing a wafer carry-in gate and a wafer carry-out gate or one carry-in, out gate.

In the wafer conveying system of the present invention, the intra-bay wafer conveying equipment is of small type.

In the wafer conveying system of the present invention, each wafer processing equipment has a wafer placing unit for transferring wafers between the wafer processing equipment and the intra-bay wafer conveying equipment of small type through the wafer carry-in gate and the wafer carry-out gate.

In the water conveying system of the present invention, the intra-bay wafer conveying equipment is a linear-motor-type track.

In the wafer conveying system of the present invention, the conveying carriage of the intra-bay wafer conveying equipment has means for preventing wafers from dropping from the conveying carriage.

The wafer conveying system of the present invention has the interface equipment which cooperates with the conveying system to transfer a cassette containing wafers therebetween. At the interface equipment, a specified number of wafers are extracted from a single or plural cassettes transferred to the interface equipment, and placed in the special cassette used only in the clean room. The intra-bay wafer conveying equipment receives the special cassette and moves with it to a specified one of the wafer processing equipments, and cooperates with the specified wafer processing equipment to transfer wafers therebetween.

In the wafer conveying system of the present invention, the interface equipment cooperates with the conveying system to transfer wafers or wafers in a cassette therebetween, and the intra-bay wafer conveying equipment operates to receive the wafers or cassette from said interface equipment, and move therewith to a specified one of the wafer processing equipments, and give the wafers to the specified wafer processing equipment and receive wafers therefrom.

BRIEF DESCRIPTION OF THE DRAWINGS

FIG. 4 is a diagram showing one example of a conventional semiconductor processing system.

DETAILED DESCRIPTION OF THE PREFERRED EMBODIMENTS

Figure 1:
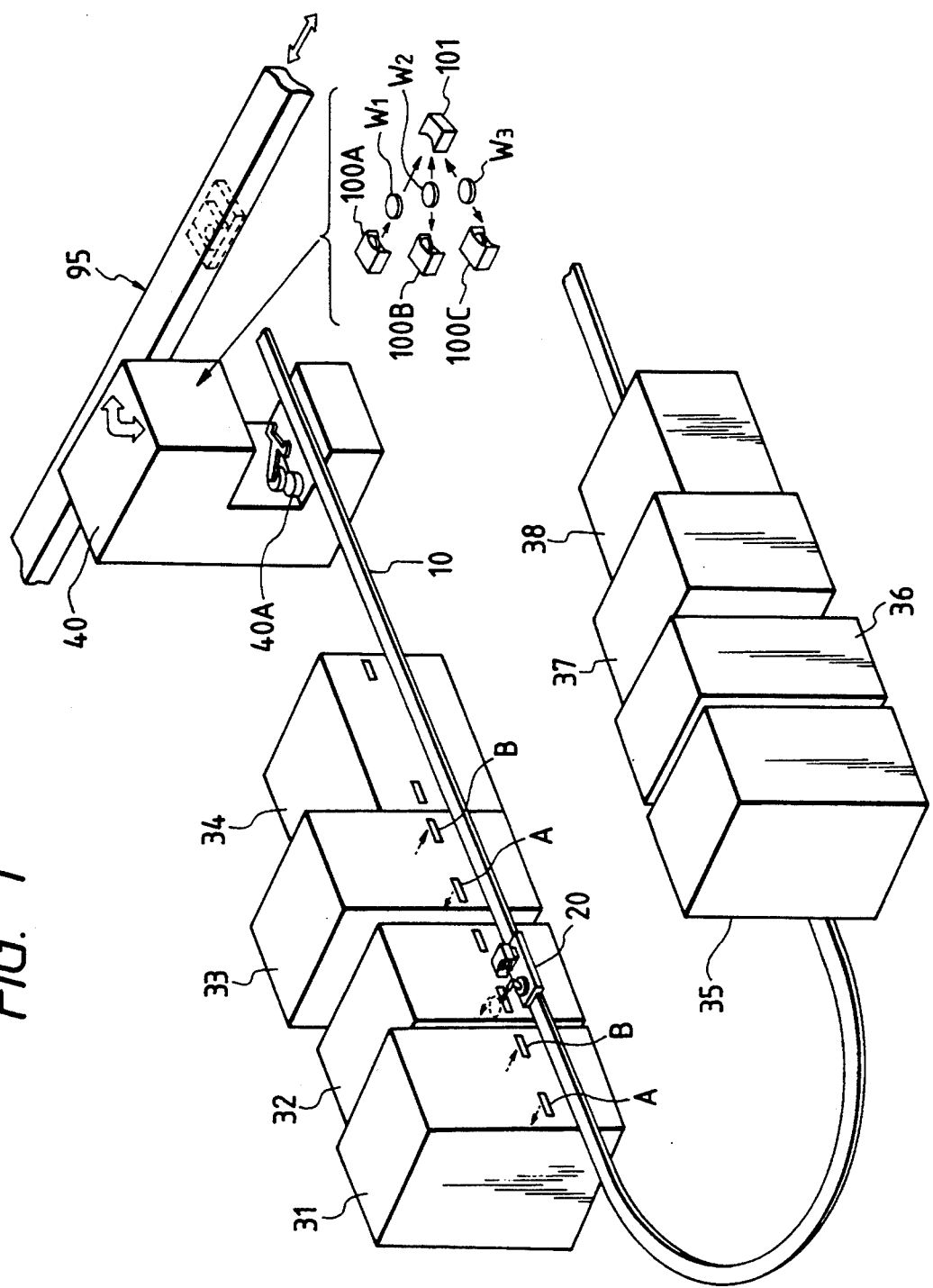
FIG. 1 is a diagram showing the arrangement of one embodiment of this invention.
Figure 2A:
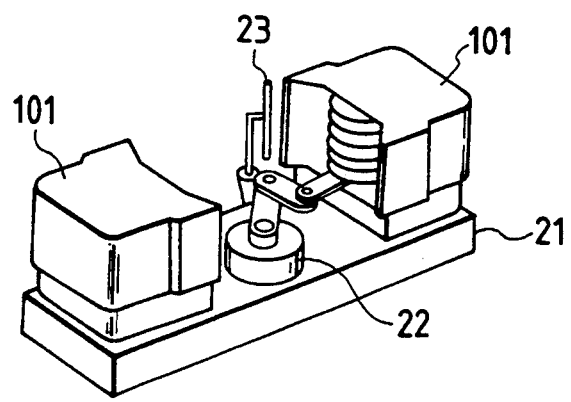
FIG. 2(a) and (b) are diagrams showing examples of an intra-bay wafer conveying equipment in the embodiment of the invention.

One embodiment of this invention will be described with reference to the accompanying drawings, FIG. 1 shows one example of the arrangement of a wafer conveying system in a clean room. In FIG. 1, reference numeral 10 designates a conveying rail; and 20, a conveying equipment which moves on the conveying rail 10 (which is a linear-motor-driven conveying equipment of magnetic levitation type in the embodiment) to convey wafers between equipments (hereinafter referred to as "an intra-bay wafer conveying equipment 20" or merely as "a wafer conveying equipment 20", when applicable). The intra-bay wafer conveying equipment 20, as shown in FIG. 2(a), has a wafer placing unit 22 for placing wafers (hereinafter referred to as "a wafer placing robot 22", when applicable) on a carriage 21. The carriage 21 has a unit 23 for preventing the drop of wafers (hereinafter referred to as "a wafer retainer 23", when applicable). The wafer retainer 23 is slidable in the direction of width of the carriage 21. Further in FIG. 1, reference numerals 31 through 37 designate wafer processing equipments, which are arranged along the conveying rail 10. Each of those wafer processing equipments 31 through 37 has a wafer carry-in gate A and a wafer carry-out gate B. A power supply equipment 38 (for instance an automatic battery charging/replacing equipment) is provided for the wafer placing unit 22.

In this embodiment, the wafer is loaded from the wafer carry-in gate A and the wafer is ejected from the carry out gate B, separately. However, according to the present invention, a single gate for loading and ejecting the wafer therefrom could be employed in the wafer processing equipment.

Further in FIG. 1, reference numeral 95 designates an inter-bay article conveying system (such as a linear-motor-operated article conveying system) for conveying articles between manufacturing lines; and 40 designates an interface (I/F) equipment which operates to carry a cassette from the inter-bay conveying system 95 into a clean room, and carry a cassette out of the clean room to the inter-bay conveying system 95.

Wafers processed on other manufacturing lines (for instance wafers subjected to thermal diffusion treatment in other manufacturing lines different from the above-described manufacturing line) are set in a cassette 100. The cassette 100 is conveyed by the inter-bay conveying system 95. The cassette 100 contain a number of wafers.

The interface equipment 40 operates as follows: It takes a predetermined number of wafers (for instance one or two wafers) W1, W2 and W3 out of cassettes 100A, 100B and 100C which are delivered from other manufacturing lines, and places them in a cassette 101 which is provided for the present line only (hereinafter referred to as "a special cassette 101", when applicable). In this connection, it should be noted that each of the cassettes 100A, 100B and 100C contains a number of wafers.

In the above-described case, the wafers taken out of the cassettes are placed in the special cassette 101 provided for the present line only. However, if the cassette 100A is available, then those wafers may be placed in the cassette 100A. In this case, the cassette 100A is used instead of the cassette 101. On the other hand, the cassettes 100A, 100B and 100C could be used as the cassette 101 regardless of the fact that the cassette 100A is empty. Moreover, if the cassettes 100A, 100B or 100C contains only the wafers to be processed in the present manufacturing line or the cassettes 100A, 100B or 100C accommodates the wafers to be processed in the present processing equipment in advance, the cassettes 100A, 100B and 100C are used as the cassette for only transferring the wafer in the present manufacturing line.

In addition, the wafers taken out of the cassettes may be placed on a wafer storing shelf (not shown) which is provided in the interface equipment 40.

The interface equipment 40 operates a cassette placing robot 40A to place the special cassette 101 on the carriage 21 of the intra-bay wafer conveying equipment 20.

The wafer conveying equipment 20, on which the special cassette 101 has been set in place as shown in FIG. 2(A), moves to a specified one of the wafer processing equipments 31 through 37 (for instance the wafer processing equipment 32), and stops there. While the wafer conveying equipment 20 is being moved, the wafer retainer 23 is slid to the front of the special cassette on the carriage 21, thereby to prevent the wafers from coming out of the special cassette 101.

In the wafer conveying equipment 20 thus stopped, the wafer placing robot 22 operates to take a specified number of specified wafers (for instance wafers W1) out of the special cassette 101, and lead them through the wafer carry-in gate A into the wafer processing equipment 32 and place them on a wafer placing unit (not shown). The wafer processing equipment 32 process the wafers W1 thus received, and waits until the wafer conveying equipment 20 comes to collect them. The wafer conveying equipment 20 receives the processed wafers from a plurality of wafer processing equipments through the wafer carry-out gates, and stores them in the special cassette 101 on the carriage 21, and then moves to the interface equipment 40.

Tracking the cassettes 100A through 100C and the special cassette 101, tracking wafers in the clean room, and controlling the wafer conveying equipment 20 and the robots 22 and 40A are carried out by a host control equipment (not shown) using radio waves. More specifically, for tracking the cassettes 100A through 100C, the special cassette 101, and wafers in the clean room, IDs (identifications) are given to them, and data for tracking and controlling the wafer conveying equipment 20, the robots 22 and 40A, etc. are transmitted between the host control equipment (not shown) and those equipments.

As was described above, in the embodiment, the present line (the above-described processing line) are operatively coupled to other manufacturing lines in the clean room through the interface equipment 40, and the latter 40 selectively receives only the wafers which are processed in the present processing line, so that wafers delivered from other manufacturing lines are collected in one special cassette. Hence, the embodiment is substantially free from the difficulty that the special cassette 101 is conveyed which is empty or contains an extremely small number of wafers (one or two wafers); that is, the embodiment is high in wafer conveying efficiency.

Furthermore, in the processing line, a plurality of wafer processing equipments 31 through 37 are provided which perform different wafer processing operations, and those wafer processing equipments 31 through 37 and the interface equipment 30 are connected to one another through the conveying path 10, and the wafer placing robot 22 is mounted on the carriage 21 of the intra-bay wafer conveying equipment, which is moved along the conveying path 10, so as to transfer wafers to the wafer processing equipments 31 through 37 and to receive wafers therefrom. Hence, a variety of wafers can be processed on one processing line with high efficiency.

In the above-described embodiment, the inter-bay wafer conveying equipment 20 operates to set wafers in the special cassette 101, and conveys the wafers thus set in the cassette 101. However, the wafer conveying equipment 20 may convey wafers received from the wafer storing shelf (not shown) as the case may be.

Figure 2B:
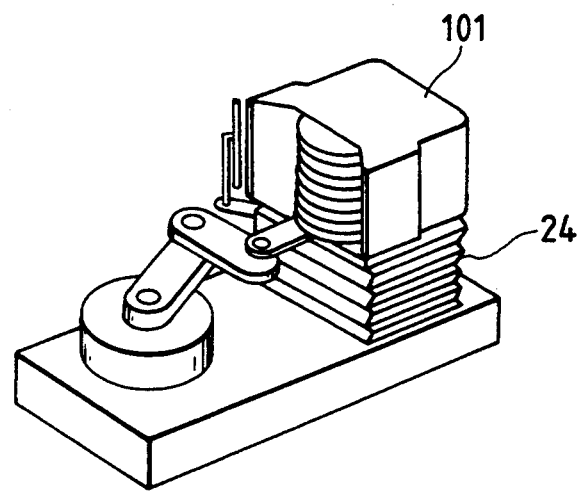

FIG. 2(B) shows another example of the inter-bay wafer conveying equipment 20. The wafer conveying equipment has a lifting mechanism 24 for placing the special cassette 101 on it.

Figure 3:
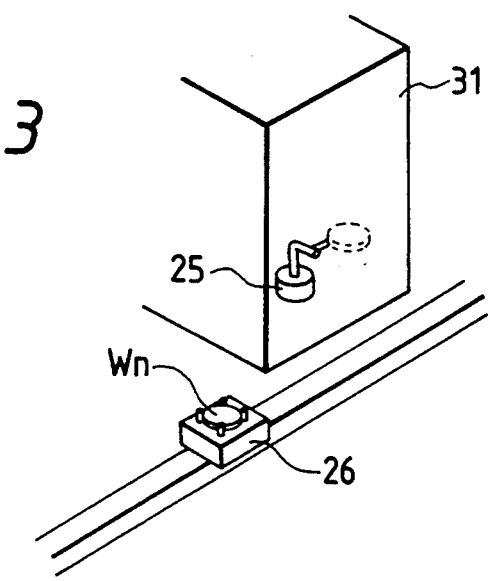
FIG. 3 is a diagram showing another example of the intra-bay wafer conveying equipment.

In the above-described embodiment, the interface equipment 40 operates to take a predetermined number of wafers (for instance one or two wafers) W1, W2 and W3 out of the cassettes 100A, 100B and 100C, and place them in the special cassette 101 in the clean room, and causes the cassette placing robot 40A to set the special cassette 101 on the carriage 21 or the wafer conveying equipment 20. However, in the manufacturing system in which the conveying system 95 conveys wafers as they are, or a cassette containing one or two wafers, the interface equipment 40 may be so modified as to have the following function. That is, the interface equipment 40 does not use the special cassette, and instead places the wafers on the intra-bay wafer conveying equipment directly. In this modification, the intra-bay wafer conveying equipment may be a small one as indicated at 26 in FIG. 3. And a wafer placing robot 25 is provided for each of the wafer processing equipment, which operates to take a wafer Wn from the wafer conveying equipment 26 into the wafer processing equipment, and transfers a wafer from the wafer processing equipment onto the wafer conveying equipment 26.

As was described above, in the invention, wafers are carried in or out of each wafer processing equipment in a matter of wafers, not in a matter of cassetes. Hence, in the wafer conveying system of the invention, the wafer conveying efficiency is high that is, a variety of wafers can be processed with high efficiency.

What is claimed is:

1. A wafer conveying system in a clean room comprising:

interface equipment for transferring wafers between intra-bay wafer conveying equipment and inter-bay wafer conveying equipment, said inter-bay wafer conveying equipment including a main cassette for transferring said wafers between a plurality of wafer processing bays arranged along a first conveying path, and said intra-bay conveying equipment conveying said wafers from the main cassette to wafer processing equipment arranged along a second conveying path to form a processing line extending from the interface equipment to different processing equipment within a bay, wherein said interface equipment operates to receive a specified number of wafers from said main cassette conveyed by said inter-bay wafer conveying equipment, and to transfer said specified number of wafers to at least one of a plurality of auxiliary cassettes provided for said processing line, said intra-bay wafer conveying equipment including means for receiving one of said auxiliary cassettes and including a robot which moves with said one of said auxiliary cassettes and said wafers to said wafer processing equipment, and individual removes wafers from said auxiliary cassette, transfers said wafers to said wafer processing equipment, receives said wafers therefrom, and places them back in the auxiliary cassette.

2. A wafer conveying system as claimed in claim 1, wherein said intra-bay wafer conveying equipment includes a conveying carriage, and wherein said robot is an arm handling robot mounted on said conveying carriage, and said wafer processing equipment has a gate for loading and unloading said wafer therefrom.

3. A wafer conveying system as claimed in claim 2 wherein said gate contains a wafer carry-in gate and a wafer carry-out gate.

4. A wafer conveying system as claimed in claim 1, further comprising means for moving said intra-bay wafer conveying equipment, and wherein said means for moving includes a linear motor and a track.

5. A wafer conveying system as claimed in claim 1, wherein said intra-bay wafer conveying equipment includes a conveying carriage provided with drop prevention means for preventing said wafers from dropping from said conveying carriage.

6. A wafer conveying system in a clean room comprising:
   interface equipment for transferring wafers between intra-bay wafer conveying equipment and inter-bay wafer conveying equipment, said inter-bay wafer conveying equipment including a main cassette for transferring said wafers between a plurality of wafer processing bays arranged along a first conveying path, and said intra-bay conveying equipment conveying said wafers from the main cassette to wafer processing equipment arranged along a second conveying path to form a processing line extending from the interface equipment;
   wherein said interface equipment operates to transfer individual ones of said wafers and an auxiliary cassette containing said wafers between said interface equipment and said intra-bay wafer conveying equipment, said intra-bay wafer conveying equipment including a robot which moves with said auxiliary cassette to said wafer processing equipment, and gives said individual ones of said wafers to said wafer processing equipment and receives said individual ones of said wafers therefrom.

7. A wafer conveying system as claimed in claim 6, wherein said intra-bay wafer conveying equipment includes:
   a conveying carriage; and
   wherein said robot is an arm handling robot mounted on said conveying carriage, and said wafer processing equipment has a gate for loading and unloading said wafer therefrom.

8. A wafer conveying system as claimed in claim 7, wherein said gate contains a wafer carry-in gate and a wafer carry-out gate.

9. A wafer conveying system as claimed in claim 8, wherein said wafer processing equipment includes:
   an arm handling unit for transferring said wafers between said wafer processing equipment and said intra-bay conveying equipment through said gate.

10. A wafer conveying system as claimed in claim 6, further comprising means for moving said intra-bay wafer conveying equipment, said moving means including a track selected from the group consisting of a linear motor track and a roller track.

11. A wafer conveying system as claimed in claim 6, wherein said intra-bay wafer conveying equipment includes a conveying carriage provided with drop prevention means for preventing said wafers from dropping from said conveying carriage.

* * * * *